US008428543B2

(12) United States Patent
Adler et al.

(10) Patent No.: US 8,428,543 B2
(45) Date of Patent: *Apr. 23, 2013

(54) RECEIVER ARRANGEMENT WITH AC COUPLING

(75) Inventors: Bernd Adler, Munich (DE); Dieter Pimingsdorfer, Linz (AT); Harald Pretl, Schwertberg (AT); Werner Schelmbauer, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 85 days.

This patent is subject to a terminal disclaimer.

(21) Appl. No.: 13/088,768

(22) Filed: Apr. 18, 2011

(65) Prior Publication Data
US 2011/0189969 A1 Aug. 4, 2011

Related U.S. Application Data

(63) Continuation of application No. 10/481,535, filed on Aug. 13, 2004, now Pat. No. 7,929,936.

(30) Foreign Application Priority Data

Jun. 29, 2001 (DE) .................................. 101 31 676

(51) Int. Cl.
*H04B 1/10* (2006.01)
(52) U.S. Cl.
USPC .................... 455/296; 455/182.1; 455/334
(58) Field of Classification Search .................. 455/296, 455/334, 182.1, 76, 77, 85, 260
See application file for complete search history.

(56) References Cited

U.S. PATENT DOCUMENTS

| 5,212,826 A | 5/1993 | Rabe et al. |
| 5,471,665 A | 11/1995 | Pace et al. |
| 5,724,653 A | 3/1998 | Baker et al. |
| 5,748,681 A | 5/1998 | Comino et al. |
| 5,896,562 A | 4/1999 | Heinonen |

(Continued)

FOREIGN PATENT DOCUMENTS

| DE | 4143537 C2 | 11/1996 |
| DE | 19810558 A1 | 9/1999 |

(Continued)

OTHER PUBLICATIONS

Schelmbauer, Werner, et al.; "A Fully Integrated Analog Baseband IC for an UMTS Zero-IF Receiver", Jun. 2000, Telematik, pp. 10-13.

(Continued)

*Primary Examiner* — Christian Hannon
(74) *Attorney, Agent, or Firm* — Eschweiler & Associates, LLC

(57) ABSTRACT

A receiver arrangement with AC coupling is specified in which a filter arrangement (3) is provided in a baseband signal processing chain in a homodyne receiver and can be switched between at least two high-pass filter cut-off frequencies. In this case, a brief changeover is made to a higher cut-off frequency when varying the gain of a low-noise baseband amplifier (2), for example when the received field strength changes, during the reception mode. The described arrangement allows changes to be carried out to the gain in baseband during the normal reception mode. The present receiver is accordingly suitable for code division multiple access methods, such as those which are provided in the UMTS Standard.

11 Claims, 4 Drawing Sheets

U.S. PATENT DOCUMENTS

| | | |
|---|---|---|
| 6,009,126 A | 12/1999 | Van Bezooijen |
| 6,144,243 A | 11/2000 | Vaisanen |
| 6,370,360 B1 | 4/2002 | Kunkel |
| 6,539,066 B1 | 3/2003 | Heinen |
| 6,940,916 B1 | 9/2005 | Warner et al. |
| 6,987,951 B2 | 1/2006 | Boos |
| 7,062,244 B2 | 6/2006 | Gharpurey et al. |
| 7,106,805 B2 | 9/2006 | Atkinson et al. |
| 7,304,534 B2 | 12/2007 | Koller et al. |
| 7,587,001 B2 | 9/2009 | Hazani et al. |
| 7,929,936 B2 * | 4/2011 | Adler et al. ............ 455/296 |
| 2003/0125000 A1 | 7/2003 | Gharpurey et al. |

FOREIGN PATENT DOCUMENTS

| | | |
|---|---|---|
| EP | 0255175 A2 | 2/1988 |
| EP | 0948128 A1 | 10/1999 |
| WO | 9729552 A1 | 8/1997 |
| WO | 9838799 A1 | 9/1998 |
| WO | 0124352 A1 | 4/2001 |

OTHER PUBLICATIONS

Lee, Kyeongho, et al.; "A Single-Chip 2.4GHz Direct-Conversion CMOS Receiver for Wireless Local Loop Using One-Third Frequency Local Oscillator", Jun. 15-17, 2000; Symposium on VLSI Circuit, pp. 42-45.

Office Action dated Dec. 28, 2008 in connection with U.S. Appl. No. 10/481,535.

Office Action dated Jun. 24, 2010 in connection with U.S. Appl. No. 10/481,535.

Office Action dated Jun. 29, 2009 in connection with U.S. Appl. No. 10/481,535.

Office Action dated Dec. 29, 2009 in connection with U.S. Appl. No. 10/481,535.

Notice of Allowance dated Mar. 21, 2011 in connection with U.S. Appl. No. 10/481,535.

* cited by examiner

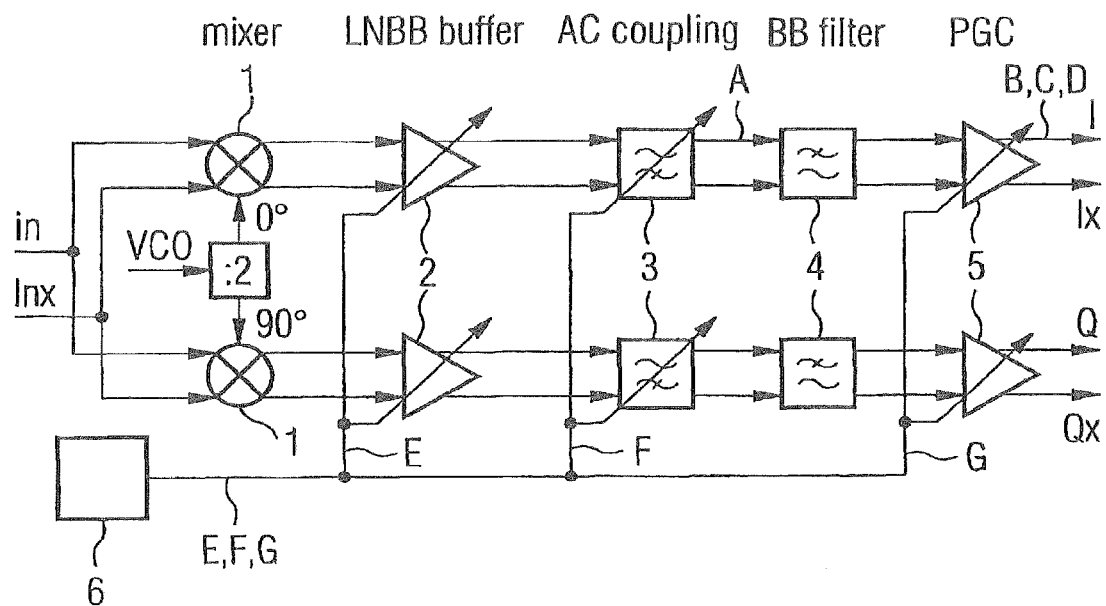
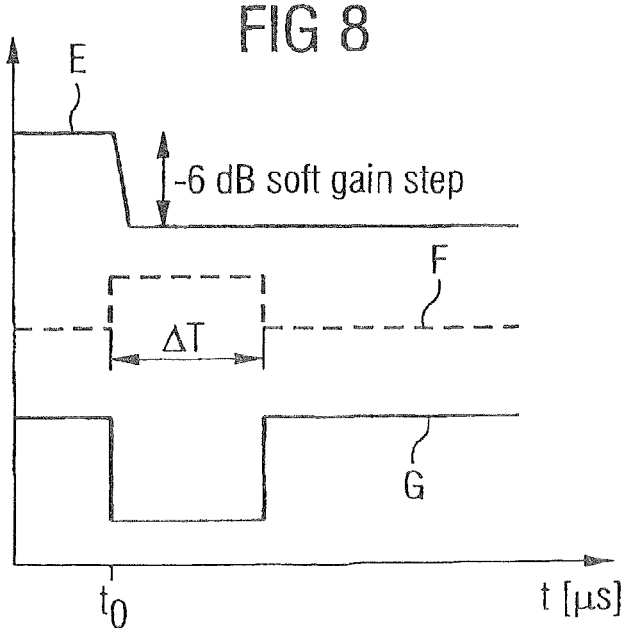

RECEIVER ARRANGEMENT WITH AC COUPLING

REFERENCE TO RELATED APPLICATIONS

This application is a Continuation of U.S. patent application Ser. No. 10/481,535 filed Dec. 19, 2003, entitled "RECEIVER ARRANGEMENT WITH AC COUPLING," which claims priority to PCT Application Serial No. PCT/DE02/02266 filed Jun. 21, 2002, entitled "RECEIVER ARRANGEMENT WITH AC COUPLING," which claims priority to the German Application Serial No. DE 10131676.3 filed Jun. 29, 2001.

FIELD OF INVENTION

The present invention relates to a receiver arrangement with AC coupling.

BACKGROUND

A distinction is drawn between homodyne and heterodyne architectures for mobile radio receivers. While, in the case of heterodyne mobile radio receivers, a received radio-frequency signal is first of all converted to an intermediate frequency in order subsequently to be converted to baseband, homodyne mobile radio receivers convert the radio-frequency signal to baseband in only one conversion step. Homodyne mobile radio receivers such as these are also referred to as zero-IF or as direct conversion (DC) receivers and are used, for example, in the so-called third-generation mobile radio standard, Universal Mobile Telecommunications System, UMTS.

One system-dependent disadvantage of direct conversion is DC voltage offsets which, on the one hand, may be of a static nature, and on the other hand may be of a dynamic nature. The static offsets are caused inter alia by circuitry-dependent offsets in the individual blocks of the receiver chains, for example as a result of large pairing tolerances of the components.

If the received signal is weak, that is to say the described DC offsets may be many times higher than the actual useful signal, the offsets are also amplified with the baseband amplification that is required for the useful signal, so that a signal which is too large for digitization would be produced at the output of the analog baseband chain and at the input of the analog/digital converter that is normally provided there. It is therefore essential to use circuitry measures to compensate for such DC voltage offsets. Conventional methods to compensate for a DC voltage offset in the analog baseband chain are based either on the high-pass filter principle and are provided by means of simple AC couplings, or feedback loops are provided, with the feedback path having low-pass filter characteristics.

Overall, these methods have the disadvantage that, on the one hand, a low cut-off frequency is required for the high-pass filter in order to avoid excessively distorting the useful signal, while, on the other hand, a high cut-off frequency is required in order to ensure that the stabilization time of the AC coupling is not too long. Furthermore, many direct converters have adaptive gain control which is dependent on the received field strength of the radio-frequency signal. However, gain control systems such as these result in sudden changes in the gain, resulting in transient equalization processes which can exceed the useful signal by many times, so that the analog/digital converter cannot be driven ideally.

The described problems relating to transient equalization processes resulting from changes to gain factors are exacerbated by the fact that such transients would be amplified many times further by subsequent amplifier stages, for example programmable amplifiers.

In the case of mobile radio methods such as GSM, which operate using Time-Division Multiple access TDMA and accordingly transmit and receive in time slots, the described problems can be avoided by making changes to the gain only between time slots. In the case of mobile radio methods for which continuous reception is required, for example in the case of systems which operate using CDMA, Code Division Multiple Access methods, it is however, desirable to match the gain to the received field strength even when the receiver is being operated without any pauses.

The object of the present invention is to specify a receiver arrangement with AC coupling in which it is possible to match the gain in the receiver during a normal reception mode.

SUMMARY

According to the invention, the object is achieved by a receiver arrangement with AC coupling, comprising
  an input for supplying a radio-frequency signal,
  a frequency converter which is coupled to the input and produces a baseband signal at its output,
  a baseband amplifier with variable gain, which is connected to the output of the frequency converter and has a control input for varying the gain,
  a filter arrangement for AC coupling, with an input which is connected to an output of the baseband amplifier and with a high-pass filter for filtering the baseband signal, with a cut-off frequency which can be switched between at least two values, with the lower of the at least two cut-off frequencies being used in a normal mode and with the higher of the at least two cut-off frequencies being used in a changeover mode, and with a control input for varying the cut-off frequency, and
  a control circuit for activation of the higher cut-off frequency during the changeover mode on the basis of a readjustment of the gain of the baseband amplifier, with an output which is connected to the control inputs of the baseband amplifier and of the filter arrangement.

The high-pass filter which is provided for AC coupling in the baseband section of the signal processing chain allows the received useful signal to be transmitted with a high degree of accuracy with a lower cut-off frequency which is set during normal operation, for example of 2 KHz. If the gain ratio of the amplifier is changed, for example if the received field strength changes, the process is in contrast switched to a higher cut-off frequency of, for example, >1 MHz, thus allowing the filter to stabilize more quickly. The higher cut-off frequency is in this case activated for a time interval which can be defined, for example of a few microseconds, and the process then switches back again to the lower cut-off frequency, that is to a longer time constant.

The described capability to switch the cut-off frequency for the AC coupling thus allows matching or slaving of the amplifier power to the reception conditions for example of a mobile station, so that the receiver present is suitable for mobile radio methods which do not operate with time slots but in which continuous reception operation must be ensured.

The described change to the gain of the baseband amplifier, which is preferably designed as a low-noise amplifier, with variable gain is preferably carried out using so-called soft switching, that is to say without any abrupt, sudden transition.

Since the described arrangement makes it possible to drive an analog/digital converter that is connected downstream from the receiver arrangement at an optimum operating point, this analog/digital converter can be constructed to be less complex and with less resolution.

The described arrangement allows changes to the gain during normal reception.

In one preferred embodiment of the present invention, the control circuit is designed such that the higher cut-off frequency is activated for a variable time interval, which starts at the time of the change to the gain of the baseband amplifier. After a change to the baseband gain, the process is switched to the higher cut-off frequency for a few microseconds, for example, in order to allow rapid stabilization and a transient equalization process of short duration.

In a further preferred embodiment of the invention, the higher cut-off frequency is greater than or equal to 1 MHz.

In a further preferred embodiment of the present invention, the filter arrangement comprises a low-pass filter which can be connected and is coupled to the control circuit in order to activate the low-pass filter effect during the changeover mode.

The low-pass filter which can be connected and is preferably connected upstream of the high-pass filter avoids a sampling effect when the higher cut-off frequency is activated, as can occur in particular when the useful signal is not significantly less than the sudden DC voltage change that is caused by amplifier switching. A baseband signal that has been subjected to low-pass filtering is in this case supplied to the high-pass filter with the higher cut-off frequency during the activation of the higher cut-off frequency. This low-pass filtering effect reduces the sampling effect in particular in the case of large adjacent channels, that is to say when the filter arrangement is connected upstream of the channel filter in baseband. However, the described AC coupling with the filter arrangement is in fact required at the start of the baseband chain in order to eliminate DC offsets which occur as a result of the frequency conversion and are caused, for example, by mismatches in the mixer.

programmable In a further preferred embodiment of the present invention, a programmable amplifier is provided, is coupled to the output of the filter and is connected to the control circuit, in order to set the lowest gain which can be set during the changeover mode.

With the described activation of the smallest gain which can be set for the amplifier, the suppression of a transient that is caused by switching of the gain factor can be reduced further. The duration of such blanking of the programmable amplifier in this case depends on the stabilization time of a channel filter which is provided in the baseband section, and preferably corresponds to the time duration of the activation of the higher cut-off frequency in the filter arrangement by means of the control circuit. By way of example, this may last for a few microseconds.

As an alternative to the described blanking of the programmable amplifier, further means for AC coupling may be inserted into the baseband chain. The described setting of the smallest gain which can be set for the programmable amplifier avoids any additional complexity, however, since the programmable amplifier is normally provided in any case and invariably has a control input for setting or programming the gain ratio.

In a further preferred embodiment of the present invention, a baseband filter is provided, and is connected between the filter arrangement and the programmable amplifier. The baseband filter is used in particular for channel filtering, that is to say for suppression of undesirable adjacent channels.

In a further preferred embodiment of the present invention, the receiver arrangement is designed for processing balanced signals.

If a local oscillator signal for down-mixing the radio frequency to the baseband frequency supplied to the described frequency converter is on the one hand left unchanged and is on the other hand supplied to the described frequency converter with a phase shift of 90.degree., and if the baseband chain is thus designed for transmitting complex-value signals, then both the in-phase signal path and the quadrature signal path can each be designed as balanced signal paths. In this case, the described baseband chain, with a frequency converter, a low-noise baseband amplifier with an adjustable gain ratio, a filter arrangement, a baseband channel filter and a programmable amplifier, is provided in both the I signal branch and in the Q signal branch.

In a further preferred embodiment of the present invention, the high-pass filter in the filter arrangement comprises a parallel branch in a balanced signal path, which has a resistor with a parallel-connected first switch. Furthermore, a series branch is in each case connected upstream of the parallel branch in the two lines which are designed for the transmission of balanced signals, and each have a capacitance.

The high-pass filter, which is constructed in analog form with resistors and capacitances, can thus be switched in a simple manner by means of the described first switch between two time constants and thus between two lower cut-off frequencies for the high-pass filtering. Instead of that described, other analog circuits may also be provided in order to form a high-pass filter.

The first switch is in this case opened during normal operation, so that the resistance in the parallel branch is effective, accordingly activating a long time constant of, for example 2 KHz. In the changeover mode, the first switch is closed, thus resulting in a high cut-off frequency of, for example, 1 MHz.

In a further preferred embodiment of the present invention, the series branches of the balanced signal path each comprise a parallel circuit formed by a resistor and a second switch, and these are in each case connected upstream of the described capacitances in the series branches.

The second switches are closed during normal operation, so that the series resistances are bridged by a short circuit. In a changeover mode, on the other hand, the second switches are opened, so that the capacitance C across the series resistance follows signal changes at the input, thus achieving low-pass filtering. This low-pass filtering avoids any sampling effect that may occur. Instead of that described, some other analogously constructed low-pass filtering may also be provided, and is connected upstream of the high-pass filter with the switchable cut-off frequency.

In a further preferred embodiment of the present invention, the control circuit is designed such that in order to activate the changeover mode, the second switches are first of all opened and the first switches are then closed, and in that, in order to return to the normal mode, the first switches are first of all opened, and the second switches are then closed.

The described switching sequence is necessary in order to reliably avoid the sampling effect. Accordingly, the low-pass filtering is activated before the high-pass filter is switched to the higher cut-off frequency and, when switching back to normal operation, is first of all switched back to the low cut-off frequency for high-pass filtering, only after which is the low-pass filtering cancelled.

Further details of the invention are the subject matter of the dependent claims.

BRIEF DESCRIPTION OF THE DRAWINGS

The invention will be explained in more detail in the following text using a number of exemplary embodiments and with reference to the drawings, in which:

FIG. 8 shows the signal profiles of the control signals of the baseband amplifier, filter arrangement and programmable amplifier as shown in the block diagram in FIG. 7.

DETAILED DESCRIPTION

Figure 1:
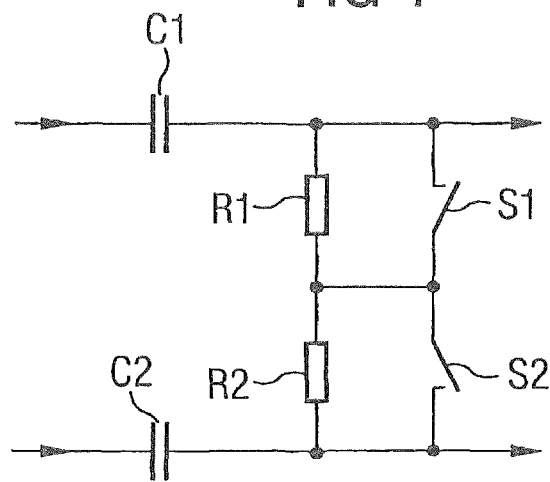
FIG. 1 shows a first exemplary embodiment of the high-pass filter for the filter arrangement.

FIG. 1 shows a filter arrangement for AC coupling for use in a balanced receiver, to be precise in its baseband signal processing chain and preferably downstream from a low-noise variable-gain baseband amplifier which is arranged at the signal output of a frequency converter for direct conversion.

The arrangement shown in FIG. 1 has a respective series capacitance C1, C2 in the two series branches of the balanced baseband signal path. On the output side a respective resistor R1, R2 is connected to the capacitances, C1, C2, with the resistors R1, R2 which are connected in series with one another and form a parallel branch in the baseband signal path, being directly connected to one another by a further connection in each case. A first respective switch S1, S2 is connected in parallel with the first resistors R1, R2.

The arrangement shown in FIG. 1 is a high-pass filter with a switchable cut-off frequency, with the cut-off frequencies being formed from the component values of the capacitances C1, C2, of the resistors R1, R2 and from parasitic elements. The switches S1, S2 are preferably switched at the same time and are connected to a control circuit.

The circuit shown in FIG. 1 is preferably suitable for use in receiver arrangements which are based on the direct conversion principle, that is to say for homodyne reception architectures.

The circuit shown in FIG. 1 in this case allows continuous reception operation even when the gain factor of an amplifier which is connected upstream of the AC coupling is changed during normal reception operation for matching the received field strength. For this purpose, a changeover is made to a considerably higher cut-off frequency when the gain factor is changed, for example by closing the switches S1, S2, so that a sudden DC change which is caused by the switching of the gain decays with a very short time constant. The cut-off frequency of the high-pass filter that is produced when the switches S1, S2 are open may in this case be chosen to be very low, for example around 2 KHz, so that the useful signal is transmitted virtually without any distortion. Overall, only a minimum amount of the information is lost from the useful signal when a sudden change in gain occurs. Any transients which may occur when switching the gain remain negligibly small. An analog/digital converter which is connected downstream from a baseband chain in a receiver with AC coupling as shown in FIG. 1 can thus be driven at the optimum operating point, so that the converter can be designed to have a particularly small number of bits for digitization. Since sudden gain changes can be carried out during normal reception, the described AC coupling is suitable for code division multiple access methods, as envisaged in the UMTS Standard.

Figure 2:
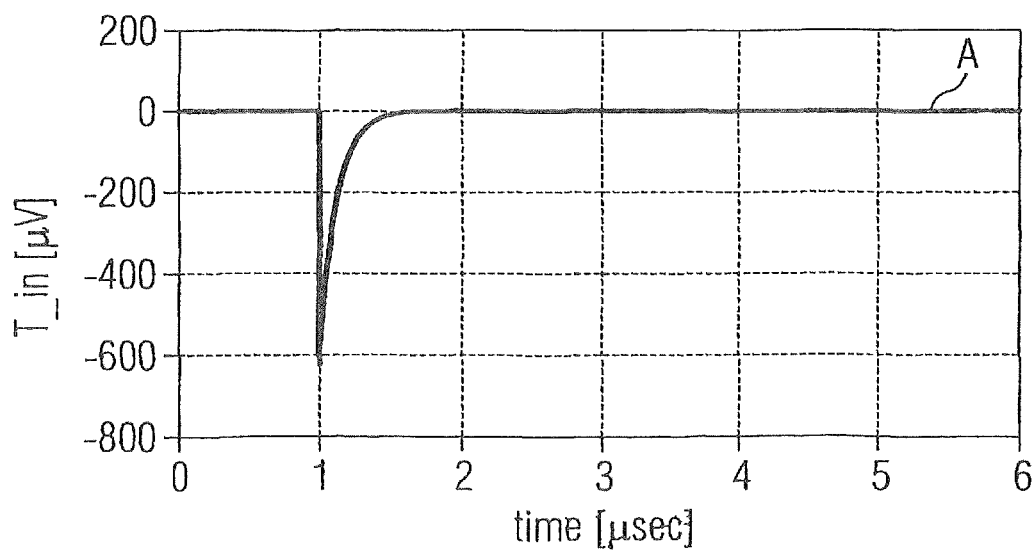
FIG. 2 shows the reduction in the equalization processes which can be achieved with the switchable cut-off frequency of the arrangement shown in FIG. 1 when changing the gain ratio.

FIG. 2 shows the time-domain profile of the voltage in microvolts plotted against the time in microseconds for a signal A at the output of the filter arrangement shown in FIG. 1, when an amplifier to whose gain a change is made is arranged at its input. The filter arrangement shown in FIG. 1 in this case has a low cut-off frequency of 2 KHz, and a high cut-off frequency of >1 MHz. The DC offset is in this case about 5 mV, and the gain changes suddenly from 18 dB to 12 dB, with the −6 dB sudden change in the upstream amplifier being made with a soft transition. As can be seen, the stabilization time for the filter arrangement has been reduced to <1 microsecond, and the transient relating to the switching time t=1 .mu.s is restricted to 0.6 mV. Without any switching of the cut-off frequency for a filter with a fixed cut-off frequency of 4 KHz, a DC offset of 5 mV and a sudden voltage gain change likewise from 18 to 12 dB, the high-pass filter would stabilize only very slowly, with the stabilization time being more than 100 .mu.s. Furthermore, a transient of 20 mV would occur which would still be amplified many times, overall up to 50 dB, by downstream amplifier stages.

Figure 3:
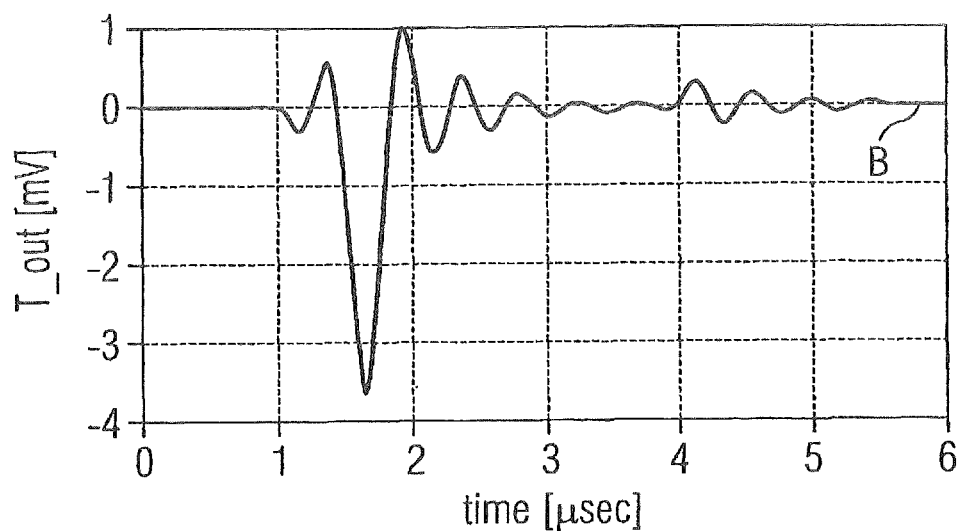
FIG. 3 shows the transient response of a baseband signal processing chain with a filter arrangement as shown in FIG. 1, as well as a downstream channel filter and a programmable amplifier on the basis of a step-function response at the output of the programmable amplifier, FIG. 4 uses a signal profile at the baseband output to show the sampling effect which occurs in particular when the useful signal is not significantly smaller than the sudden DC change which occurs by switching the gain at the start of the baseband chain.

FIG. 3 shows the step-function response B of a receiver arrangement with a low-noise variable-gain baseband amplifier and the downstream filter arrangement as shown in FIG. 1, measured at the output of a programmable amplifier which is connected downstream of a channel filter which is in turn connected to the output of the filter arrangement. This shows that the stabilization time of this overall baseband chain when a change is made to the gain factor of the baseband amplifier at the input of the baseband chain is restricted to about 3 microseconds and that the maximum transient that occurs in the process and which does not exceed 4 mV can, as an approximation, be ignored.

Figure 4:
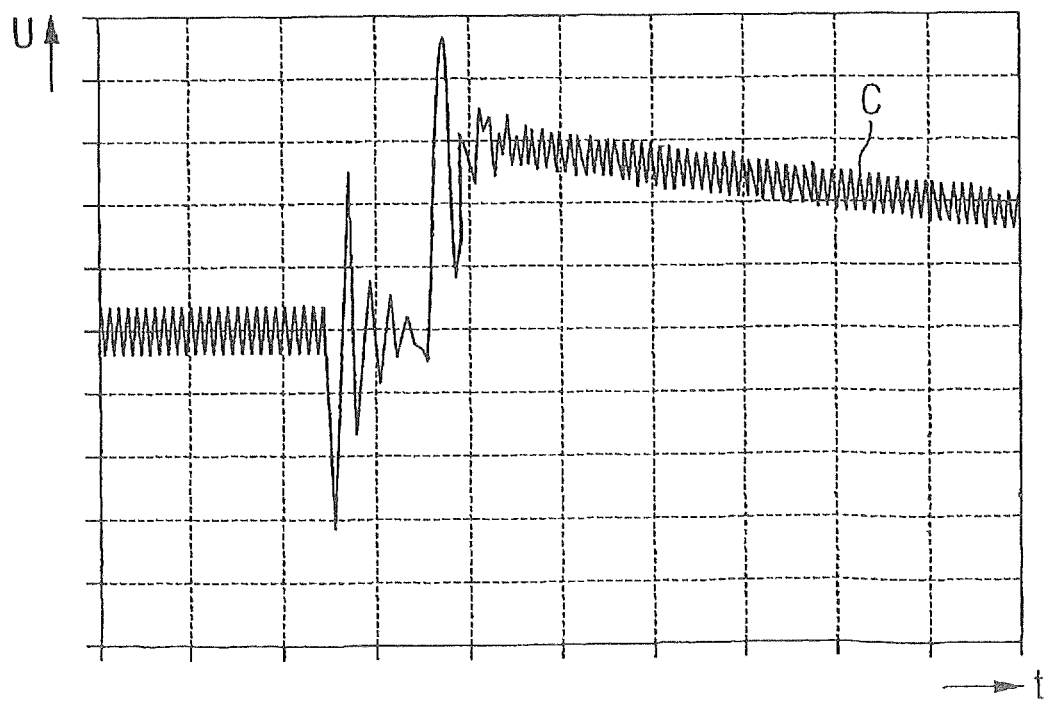

FIG. 4 shows the signal relationships on the basis of a signal profile C in the situation where the actual useful signal is not considerably less than the sudden DC change that is caused by switching the gain. During the changeover mode, that is to say when the switches S1, S2 are closed as shown in FIG. 1 and in which the high-pass filter has the high cut-off frequency, the voltage across the capacitors C1, C2 follows the input signal. When switching back to normal operation by opening the switches S1, S2, a sampling effect occurs in this case, that is to say the instantaneous signal across the capacitors C1, C2 is sampled and decays with the long time constant, that is now selected once again, for normal operation, that is to say with the cut-off frequency of 2 KHz. Such relationships can occur in particular at the start of the baseband chain where, on the one hand, AC coupling is required, since the frequency converters for conversion of the radio frequency to baseband have manufacturing-dependent DC offsets while, on the other hand, adjacent channels still exist without being filtered, since the AC coupling is carried out directly at the output of the mixers, and thus even before the channel filter in baseband. FIG. 4 describes this signal voltage as a function of the time at the output of the baseband chain, that is to say downstream from the programmable amplifier and upstream of the analog/digital converters.

Figure 5:
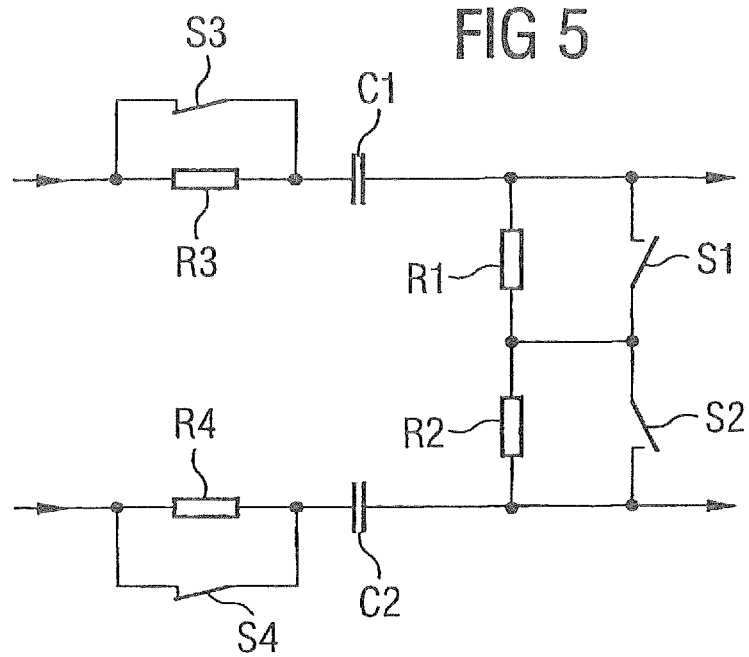
FIG. 5 uses an example to show a development of the filter arrangement shown in FIG. 1 with additional low-pass filtering in order to avoid a sampling effect.

FIG. 5 shows a filter arrangement which has been developed from that shown in FIG. 1 and which, in addition to the high-pass filter R1, R2, C1, C2 with a switchable cut-off frequency, has a low-pass filter R3, C1; R4, C2 which can be connected and is connected upstream of this high-pass filter. In this case, a series resistor is connected upstream of each of the series capacitors C1, C2 in the balanced signal path, and is annotated R3, R4. A second switch S3, S4 is connected in parallel with these series resistors R3, R4, respectively. The switch positions of the switches S1 to S4 are shown during normal operation in the present FIG. 5.

During a changeover mode, firstly, as already explained with reference to FIG. 1, the higher cut-off frequency is activated for the high-pass filter by closing the switches S1, S2, while the low-pass filter formed by R3 with C1 and R4 with C2 is additionally activated by opening the switches S3, S4. The precise switching sequence must in this case be carried out in order to avoid the sampling effect with the control circuit which drives the switches S1 to S4, such that the switches, S3, S4 are opened first of all, after which the switches S1, S2 are closed, for switching from normal operation to the changeover mode. When returning from the changeover mode to normal operation, the switches S1, S2 are opened again first of all, and the switch S3 and the switch S4 are closed only after this has occurred, in order to avoid the sampling effect. The charge on the capacitors C1, C2 is accordingly changed during the changeover mode with the time constants formed from the product of the resistance and capacitance, R3*C1 or R4*C2. This ensures that no sampling effect occurs at the output of the filter arrangement, even if the useful signal is not significantly less than the sudden DC change caused by switching the gain.

Figure 6:
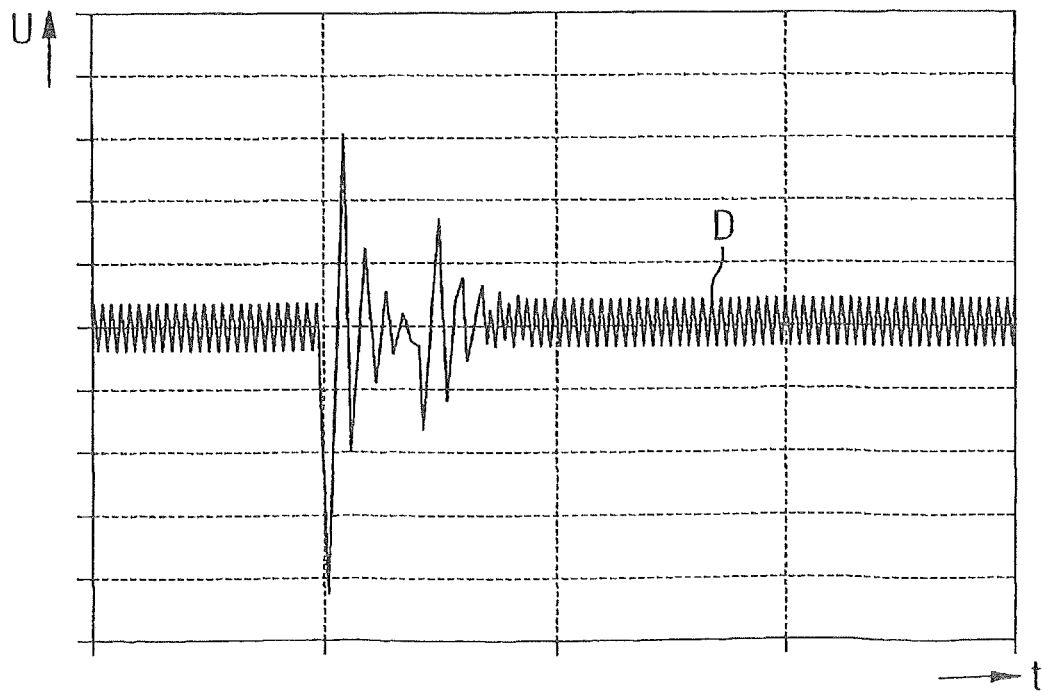
FIG. 6 shows the signal profile as shown in FIG. 5 by analogy to FIG. 4, FIG. 7 uses a block diagram to show the receiver arrangement with a filter arrangement for example as shown in FIG. 1 or 5.

FIG. 6 shows the signal profile D at the output of a baseband chain when using a circuit as shown in FIG. 5. This shows that the sampling effect no longer occurs. The stabilization processes that can still be seen during the changeover mode are caused by the channel selection filter and/or the baseband filter. These can be reduced considerably, for example, by reducing the gain after the channel selection, that is to say by means of the conventional programmable amplifier there, or can be blanked out by insertion of a further AC coupling in the signal processing chain.

FIG. 7 uses an example of a simplified block diagram to shown a homodyne receiver arrangement with AC coupling which is, for example, in the form of a filter arrangement as shown in FIG. 1 or as shown in FIG. 5. The receiver is in this case in the form of an IQ receiver for processing of complex-value signals and, in addition, for carrying the in-phase and quadrature components in each case as balanced signals.

In detail, an IQ mixer is provided for frequency conversion 1, and can be supplied with a received radio-frequency signal, in each case in the form of a balanced signal, at in each case one signal input. The mixers 1 also each have a local oscillator input, to which a local oscillator signal is supplied on the one hand unchanged and on the other hand with a phase shift of 90.degree. A baseband signal is produced on the output side of the frequency converters 1, and is likewise in the form of balanced signal. A low-noise variable gain baseband amplifier 2 is connected to the outputs of each of the frequency converters 1 in the in-phase and quadrature paths of the receiver. A high-pass filter with a variable cut-off frequency for AC coupling is connected on the output side to the low-noise baseband amplifier 2. A baseband filter 4 is coupled to each of the outputs of the high-pass filters 3 for channel selection, and each output of said baseband filter is in turn connected to a programmable amplifier or PGC, Programmable Gain Control 5. On the output side of the programmable amplifiers, that is say at the output of the baseband signal processing chain that has been explained, a filtered and amplified baseband signal is produced as a complex-value signal, broken down into an in-phase component I and a quadrature component Q, with the I and Q components each being in the form of balanced signals.

The low-noise baseband amplifiers 2, the filter arrangements 3 and the programmable amplifiers 5 each have a control input which is connected to a control circuit 6. The signal for controlling the gain of the low-noise baseband buffer 2 is annotated E, the signal for varying the desired cut-off frequency of the high-pass filter 3 is annotated F, and the signal for varying the gain of the programmable amplifier 5, in particular the minimum gain which can be set for it, is annotated G.

The method of operation of the circuit illustrated in FIG. 7, which is suitable for receiving signals coded using the code division multiple access method and which accordingly can be used for UMTS receivers, is evident from the signal profiles of the control signals E, F, G shown in FIG. 8.

FIG. 8 shows the signal profile of the control signal E for the low-noise baseband amplifier 2 which, at the time, T0, is reducing the gain by 6 dB owing to a change in the reception conditions, for example, a greater received field strength. The −6 dB step in this case has a soft gain transition. At the same time as the change to the gain, the filter arrangement 3 is switched to a higher cut-off frequency for a variable time interval .DELTA.T, that is to say the high-pass filters in the filter arrangements 3 change from normal operation to the changeover mode, starting at the time T.sub.0 and for the time period .DELTA.T. If the filter arrangement as shown in FIG. 3 is additionally designed with a low-pass filter characteristic as shown in FIG. 5, then this low-pass filter is connected upstream of the high-pass filter for the time period .DELTA.T. The programmable amplifier 5 at the end of the baseband signal processing chain is likewise switched by the control signal G to the minimum gain which can be set for it for the time period .DELTA.T and starting at the time T.sub.0 in order for it not to amplify any further a switching transient, which is invariably unavoidable even if it is very small.

The combination of the accelerated AC coupling with the higher cut-off frequency, the soft switching of the gain as shown by the signal E and the switching off of the downstream amplifier stage 5 for the stabilization time .DELTA.T which is now short of the accelerated high-pass filter as shown by the control signal G results in the described advantages, that is to say a low cut-off frequency during normal operation of the high-pass filter 3, a short stabilization time after a change to the gain, negligibly small transients relating to the switching times for the gain of the amplifier 2, an optimum drive capability for downstream analog/digital converters with the useful signal, and thus an implementation with a small number of bits as well as the capability to switch the gain of the amplifier 2 during normal reception.

Instead of the described process of switching the gain of the downstream amplifiers 5 back in accordance with the control signal G, further AC couplings may also be inserted into the baseband chain in alternative implementations.

What is claimed is:

1. A receiver arrangement with AC coupling, comprising:
an input configured to receive a radio-frequency signal;

a frequency converter coupled to the input and configured to produce a baseband signal at its output;

a variable gain baseband amplifier coupled to the output of the frequency converter, and having a control input for varying a gain thereof;

a filter arrangement for AC coupling, comprising an input coupled to an output of the variable gain baseband amplifier, the filter arrangement comprising:

a high-pass filter configured to filter the baseband signal, having a cut-off frequency that is switched between at least two values, with a lower of the at least two cut-off frequencies used during normal operation and with a higher of the at least two cut-off frequencies used in a changeover mode, and having a control input for varying the cut-off frequency; and a selectively activatable low-pass filter having a control input;

a control circuit coupled to the control inputs of the variable gain baseband amplifier and the filter arrangement, and configured to activate the higher cut-off frequency of the high-pass filter and activate the low-pass filter during the changeover mode based on a readjustment of the gain of the baseband amplifier.

2. The receiver arrangement of claim 1, wherein the control circuit is configured to activate the higher cut-off frequency in the high-pass filter of the filter arrangement during a variable time interval, wherein the variable time interval starts at a time of a gain change of the baseband amplifier based on the readjustment of the gain.

3. The receiver arrangement of claim 1, further comprising a programmable amplifier coupled to the output of the filter arrangement and to the control circuit, wherein the control circuit is configured to set a lowest gain that can be set for the programmable amplifier during the changeover mode.

4. The receiver arrangement of claim 3, further comprising a baseband filter configured to perform channel selection, wherein the baseband filter is coupled between the filter arrangement and the programmable amplifier.

5. The receiver arrangement of claim 1, wherein the receiver arrangement is configured to process balanced signals.

6. The receiver arrangement of claim 1, wherein the high-pass filter in the filter arrangement comprises a balanced signal path having therein a parallel branch that includes a first resistor and a parallel-connected first switch, the balanced signal path further including a series branch connected upstream of the parallel branch, wherein the series branch includes a first capacitance.

7. The receiver arrangement of claim 6, wherein the series branch of the balanced signal path in the filter arrangement further comprises a first parallel circuit comprising a second resistor and a parallel-connected second switch that forms with the first capacitance a portion of the selectively activatable low-pass filter, and wherein the parallel circuit is coupled upstream of the first capacitance.

8. The receiver arrangement of claim 7, wherein the control circuit is configured to open the parallel-connected second switch and close the parallel-connected first switch in the changeover mode, and open the parallel-connected first switch and close the parallel-connected second switch in the normal mode.

9. The receiver arrangement of claim 7, wherein the parallel branch further comprises a third resistor and a parallel-connected third switch, connected in series with the first resistor and the parallel-connected first switch.

10. The receiver arrangement of claim 9, wherein the filter arrangement further comprises a second parallel circuit comprising a fourth resistor and a parallel-connected fourth switch that forms with a second capacitance another portion of the selectively activatable low-pass filter, and wherein the control circuit is configured to open the parallel-connected second switch and the parallel-connected fourth switch and close the parallel-connected first switch and the parallel-connected third switch in the changeover mode, and open the parallel-connected first switch and parallel-connected third switch and close the parallel-connected second switch and the parallel-connected fourth switch in the normal mode.

11. The receiver arrangement of claim 1, wherein the higher cut-off frequency is greater than or equal to about 1 Megahertz.

* * * * *